(12) United States Patent
Anand et al.

(10) Patent No.: US 7,170,299 B1
(45) Date of Patent: Jan. 30, 2007

(54) ELECTRONIC FUSE BLOW MIMIC AND METHODS FOR ADJUSTING ELECTRONIC FUSE BLOW

(75) Inventors: Darren L. Anand, Essex Junction, VT (US); Michael R. Ouellette, Westford, VT (US); Troy J. Perry, Georgia, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/276,120

(22) Filed: Feb. 15, 2006

(51) Int. Cl.
 *H01H 85/30* (2006.01)
 *H01H 85/00* (2006.01)
 *G01R 31/00* (2006.01)

(52) U.S. Cl. .................. 324/550; 324/507; 327/525

(58) Field of Classification Search .......... 324/550, 324/537, 522, 507, 500; 257/529; 327/525
See application file for complete search history.

(56) References Cited

U.S. PATENT DOCUMENTS

| | | | |
|---|---|---|---|
| 5,347,418 A * | 9/1994 | Ando et al. ........... | 361/104 |
| 6,346,846 B1 * | 2/2002 | Bertin et al. .......... | 327/525 |
| 6,686,744 B1 * | 2/2004 | Tinsley ................ | 324/507 |
| 6,762,608 B2 * | 7/2004 | Damon et al. ........ | 324/550 |
| 2003/0090274 A1 * | 5/2003 | Kitade ................. | 324/550 |
| 2003/0112016 A1 * | 6/2003 | Lehmann et al. ...... | 324/550 |

* cited by examiner

*Primary Examiner*—Vincent Q. Nguyen
*Assistant Examiner*—Hoai-An D. Nguyen
(74) *Attorney, Agent, or Firm*—Michael J. LeStrange, Esq.; Hoffman, Warnick & D'Alessandro, LLC

(57) ABSTRACT

A system, method and program product for adjusting an environmental variable of a fuse blow of an electronic fuse are disclosed. A mimic NFET is coupled to a fuse blow source voltage line, a fuse blow gate voltage line, and a chip ground in the same manner as the electronic fuse, except that the mimic NFET is not attached to a poly fuse link. The on current (ion) and off current (ioff) of the mimic NFET are measured to determine a blow current of the electronic fuse. The environmental variable is adjusted based on the determined blow current.

20 Claims, 4 Drawing Sheets

ELECTRONIC FUSE BLOW MIMIC AND METHODS FOR ADJUSTING ELECTRONIC FUSE BLOW

BACKGROUND OF THE INVENTION

1. Technical Field

The invention relates generally to electronic fuse blow, and more particularly, to a method and system for mimicking an electronic fuse blow and adjusting the same.

2. Background Art

An electronic fuse is basically a poly silicon fuse link which is coupled to a voltage line (usually referred to as a FSource) on one end, and to the top of an n-channel field-effect transistor (NFET) on the other end. FIG. 1 shows a configuration of an electronic fuse 10 including a poly silicon fuse link 12 and an NFET 14. NFET 14 of fuse 10 is usually referred to as a blowFET 14. The gate of blowFET 14 is coupled to a gate voltage 24. During a fuse blow, a voltage is supplied by the FSource and NFET 14 is turned on by, inter alia, a gate voltage (Vdd or blow Vdd) 24, for a particular amount of time, which allows controlled electromigration to occur, which causes a salicide/boron pile-up on an anode side (not shown) of poly fuse link 12. The resistance across poly fuse link 12 may rise from hundreds of ohms to many Kilo-ohms.

As is known in the art, the fuse resistance rise during a fuse blow needs to meet a particular chip characteristic requirement. Using a "one size fits all" approach to a fuse blow will probably result in two undesirable results, i.e., ruptured fuse or weak fuse blow. As such, if chip characteristics vary, the fuse blow process may need to be altered to provide the desired fuse yield. That is, the environmental variables of a fuse blow process, e.g., blow Vdd 24, FSource voltage, or the fuse blow time, may need to be varied according to a different characteristic requirement of the chip. However, the current state of art technology provides no satisfactory solution to determine whether and how an environmental variable needs to be varied.

Based on the above, there is a need in the art for an invention that addresses, among others, the above described problems.

SUMMARY OF THE INVENTION

A system, method and program product for adjusting an environmental variable of a fuse blow of an electronic fuse are disclosed. A mimic NFET is coupled to a fuse blow source voltage line, a fuse blow gate voltage line, and a chip ground in the same manner as the electronic fuse, except that the mimic NFET is not attached to a poly fuse link. The on current (ion) and off current (ioff) of the mimic NFET are measured to determine a blow current of the electronic fuse. The environmental variable is adjusted based on the determined blow current.

A first aspect of the invention provides a method for adjusting a fuse blow environmental variable of an electronic fuse on an integrated circuit chip, the electronic fuse including a poly silicon fuse link and a blow n-channel field-effect transistor (NFET) attached to each other, the method comprising: providing the electronic fuse, the electronic fuse being coupled to a fuse blow source voltage line, a fuse blow gate voltage line, and a chip ground; coupling a mimic NFET to the fuse blow source voltage line, the fuse blow gate voltage line, and the chip ground in same manner as the electronic fuse, except that the mimic NFET is not attached to a poly silicon fuse link; measuring an on current (ion) and an off current (ioff) of the mimic NFET under a preset value of the fuse blow environmental variable; determining a fuse blow current of the electronic fuse under the preset value of the fuse blow environmental variable based on a difference between the measured on current (ion) and off current (ioff) of the mimic NFET; and adjusting the preset value of the environmental variable based on the determined fuse blow current.

A second aspect of the invention provides a computer program product for adjusting a fuse blow environmental variable of an electronic fuse on an integrated circuit chip, the electronic fuse including a poly silicon fuse link and a blow n-channel field-effect transistor (NFET) attached to each other, and the electronic fuse being coupled to a fuse blow source voltage line, a fuse blow gate voltage line, and a chip ground, the computer program product comprising: computer usable program code configured to: control measuring an on current (ion) and an off current (ioff) of a mimic NFET under a preset value of a fuse blow environmental variable, the mimic NFET being coupled to the fuse blow source voltage line, the fuse blow gate voltage line, and the chip ground in same manner as the electronic fuse, except that the mimic NFET is not attached to a poly silicon fuse link; determine a fuse blow current of the electronic fuse under the preset value of the fuse blow environmental variable based on a difference between the measured on current (ion) and off current (ioff) of the mimic NFET; and determine an adjustment of the preset value of the environmental variable based on the determined fuse blow current.

A third aspect of the invention provides a system for dynamically adjusting a fuse blow environmental variable of an electronic fuse on an integrated circuit chip, the electronic fuse including a poly silicon fuse link and a blow n-channel field-effect transistor (NFET) attached to each other, and the electronic fuse being coupled to a fuse blow source voltage line, a fuse blow gate voltage line, and a chip ground, the system comprising: a measurer for measuring an on current (ion) and an off current (ioff) of a mimic NFET under a preset value of a fuse blow environmental variable, the mimic NFET being coupled to the fuse blow source voltage line, the fuse blow gate voltage line, and the chip ground in same manner as the electronic fuse, except that the mimic NFET is not attached to a poly fuse link; a determinator for determining a fuse blow current of the electronic fuse under the preset value of the fuse blow environmental variable based on a difference between the measured on current (ion) and off current (ioff) of the mimic NFET; and an adjuster for adjusting the preset value of the environmental variable based on the determined fuse blow current.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

Figure 1:
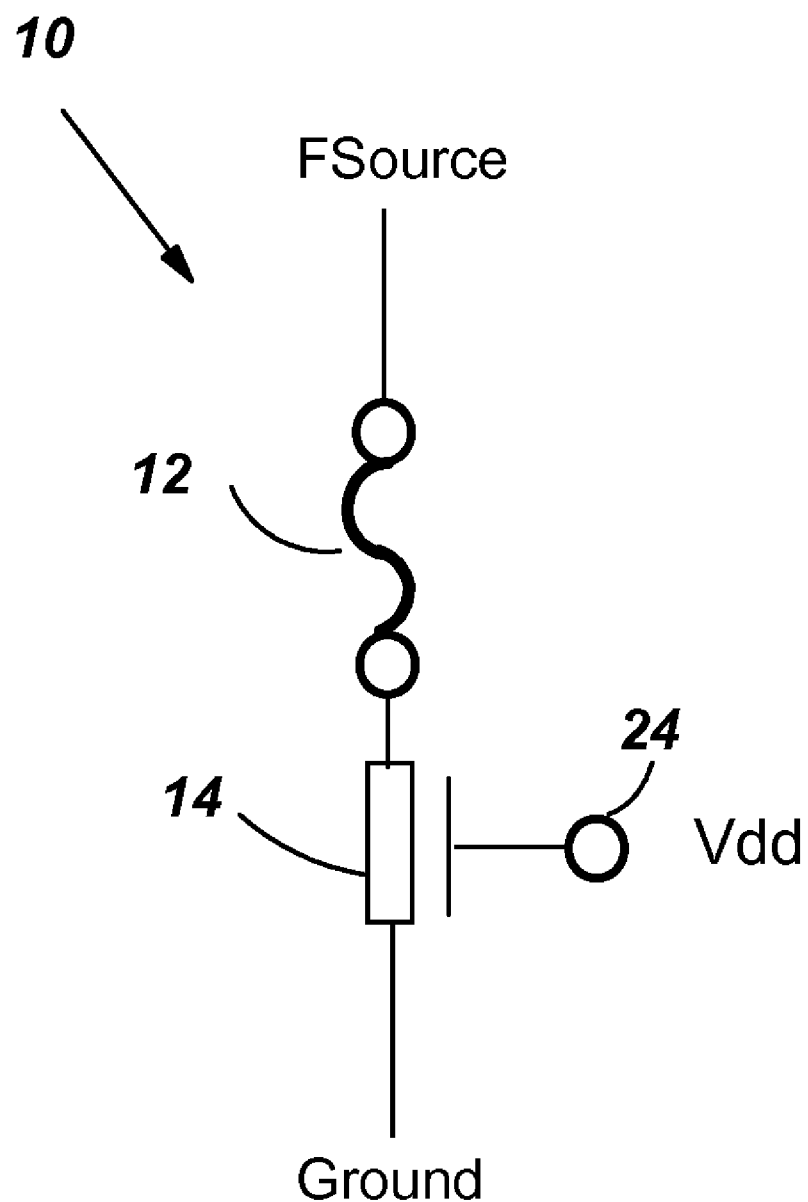
FIG. 1 shows a configuration of an electronic fuse according to prior art.
Figure 2:
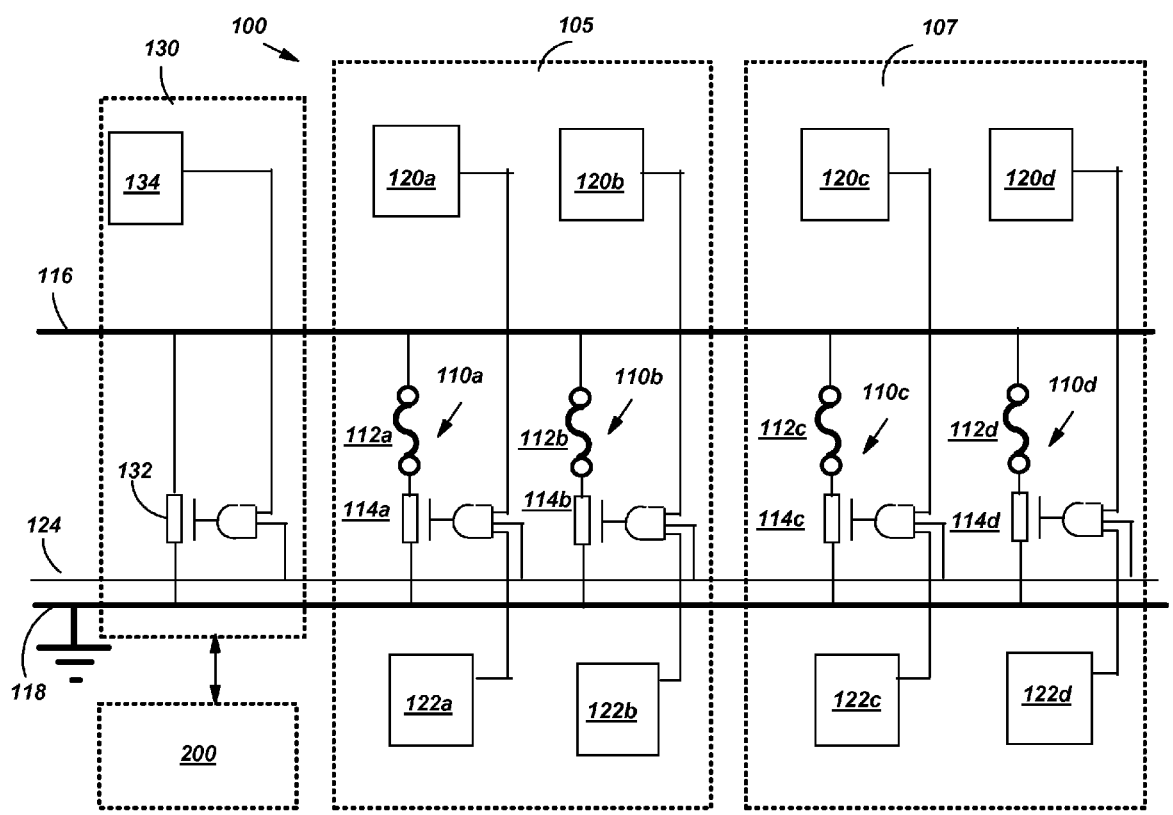
FIG. 2 shows an illustrative embodiment of a hardware implementation system for mimicking an electronic fuse blow according to the invention.

Turning to the drawings, FIG. 2 shows an illustrative embodiment of a hardware implementation system 100 for mimicking an electronic fuse blow. As is known in the art, an application specific integrated circuit (ASIC) may include, among other components, an electronic chip identification (ECID) macro which contains electronic fuses. The ASIC may also include electronic fuses present for the purpose of implementing certain redundancy structures, such as structures commonly found in memory arrays (i.e. redundant wordlines or redundant columns). The fuses may be blown to disconnect a normal wordline and replace it with a redundant wordline if, for example, the normal wordline is detected as defective. In FIG. 2, implementation system 100 includes electronic fuses (110a and 110b) within an ECID macro 105, and electronic fuses (110c and 110d) within a redundancy fuse bay 107 of an integrated circuit chip (not shown), for illustrative purpose only. Each fuse (110a–110d) includes a poly silicon fuse link, 112a–112d, respectively and a blowFET 114a–114d respectively. According to one embodiment, blowFETs 114 are of the same size. However this may not be necessary in all cases. Each fuse 110 is coupled between a FSource 116 and a chip ground 118. FSource 116 provides a fuse blow source voltage (hereinafter, FSource voltage). According to one embodiment, the blowFETs 114a–114d are controlled by scan-able or otherwise controllable latches 120a–120d and 122a–122d, respectively, to enable or disable fuses 110. It is understood that any now known and later developed methods for enabling and disabling fuses 110 are also included in the current invention. Specifically, when the latches 120 and 122 are set low, blowFETs 114 are de-selected and fuses 110 are disabled. BlowFETs 114 are also coupled to a blow enable line 124, which provides a fuse blow gate voltage (hereinafter, blow Vdd) to the gates of blowFETs 114. It is understood that ECID 105 and redundant fuse bay 107 are used for illustration only and are not meant to limit the scope and the current invention, and the current invention can be used with respect to all fuses on a chip.

As shown in FIG. 2; implementation system 100 includes a test device 130 including an n-channel field-effect transistor (NFET) 132 (herein after "mimic FET") 132 and a controllable latch 134, Controllable latch 134 is coupled to the gate of mimic FET 132 to control mimic FET 132. As such, controllable latch 134 will be referred to as a mimic enable latch 134, for descriptive purposes only. According to one embodiment, mimic FET 132 is of the same size as blowFETs 114. However, it is understood that mimic FET 132 may be of different size than blowFET 114, as will be described later, Mimic FET 132 is coupled between FSource 116 and ground 118 and is coupled to blow enable line 124 (providing blow Vdd) in the same manner as fuses 110 including blowFETs 114, except that mimic FET 132 is built into the chip without a poly silicon fuse link attached. It is understood that test device 130 may be built into the chip or may be attached to the chip. Test device 130 may also be responsive to a computer system 200 (see FIG. 4 for details) that controls the operation of, inter alia, test device 130.

Figure 3:
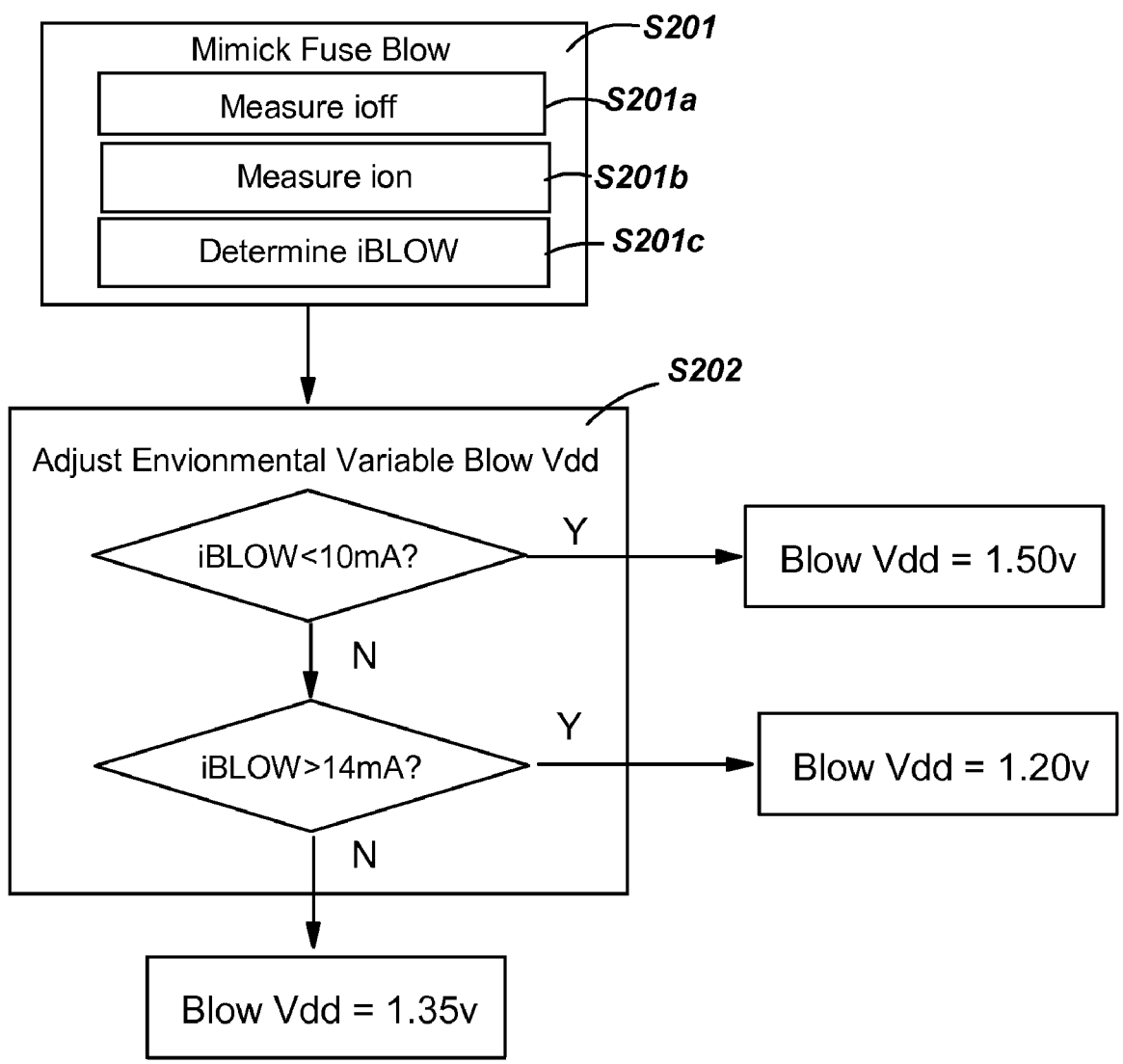
FIG. 3 shows a flow diagram of mimicking and adjusting a fuse blow of an electronic fuse using the hardware implementation of FIG. 2 according to the invention.

FIG. 3 shows a flow diagram of a method of mimicking and adjusting a fuse blow of electronic fuses 110 using implementation system 100 of FIG. 2. First in step S201, fuse blows of fuses 110 are mimicked using mimic FET 132. During the mimicking process, blowFETs 114 of fuses 110 are disabled through, e.g., a chip scan. For example, controllable latches 120 and 122 are set low through the chip scan. Specifically, in step S201a, an off current (ioff) of mimic FET 132 is measured. According to one embodiment, FSource 116 and blow enable line 124 are held high, with a FSource 116 voltage and a blow Vdd of blow enable line 124 both being set the same as their respective preset values to be used during the fuse blow, for example, 3.30V and 1.35V for FSource 116 voltage and the blow Vdd, respectively. A current through mimic FET 132 is measured. This current is the off current (ioff) of mimic FET 132.

Next, in step S201b, an on current (ion) of mimic FET 132 is measured. According to one embodiment, mimic enable latch 134 is set high through, e.g., a chip scan, which turns on mimic FET 132, with FSource 116 and blow enable line 124 still on. The current through mimic FET 132, i.e., on current (ion), is then measured.

Next in step S201c, the fuse blow current (iBLOW) for fuses 110 (under blow Vdd of, e.g., 1.35V) is determined based on the difference between the measured on current (ion) and off current (ioff) of mimic FET 132. If mimic FET 132 is of exactly the same size as blowFETs 114, the difference between the measured on current (ion) and off current (ioff) of mimic FET 132 is the iBLOW for fuses 110. If mimic FET 132 is of different size than blowFETs 114, the difference between the measured on current (ion) and off current (ioff) of mimic FET 132 may be converted into iBLOW using now known or later developed methods.

Next in step S202, an environmental variable of the fuse blow, for example, blow Vdd provided by blow enable line 124, is adjusted based on the results of the mimicking step of S201. According to one embodiment, a three-way decision may be performed. Specifically, an upper level threshold, for example, 14 mA, and a lower level threshold, for example, 10 mA, are set for the determined iBLOW. If the determined iBLOW is higher than the upper level threshold, here 14 mA, the blow Vdd provided by blow enable line 124 may be decreased, for example, from the preset 1.35V to 1.20V. If the determined iBLOW is lower than the lower level threshold, here 10 mA, the blow Vdd provided by blow enable line 124 may be increased, for example, from the preset 1.35V to 1.50V. Also, if the determined iBLOW is within the range between the upper level threshold, here 14 mA, and the lower level threshold, here 10 mA, the blow Vdd provided by blow enable line 124 may be considered proper and be maintained the same as the preset value, here 1.35V.

Figure 4:
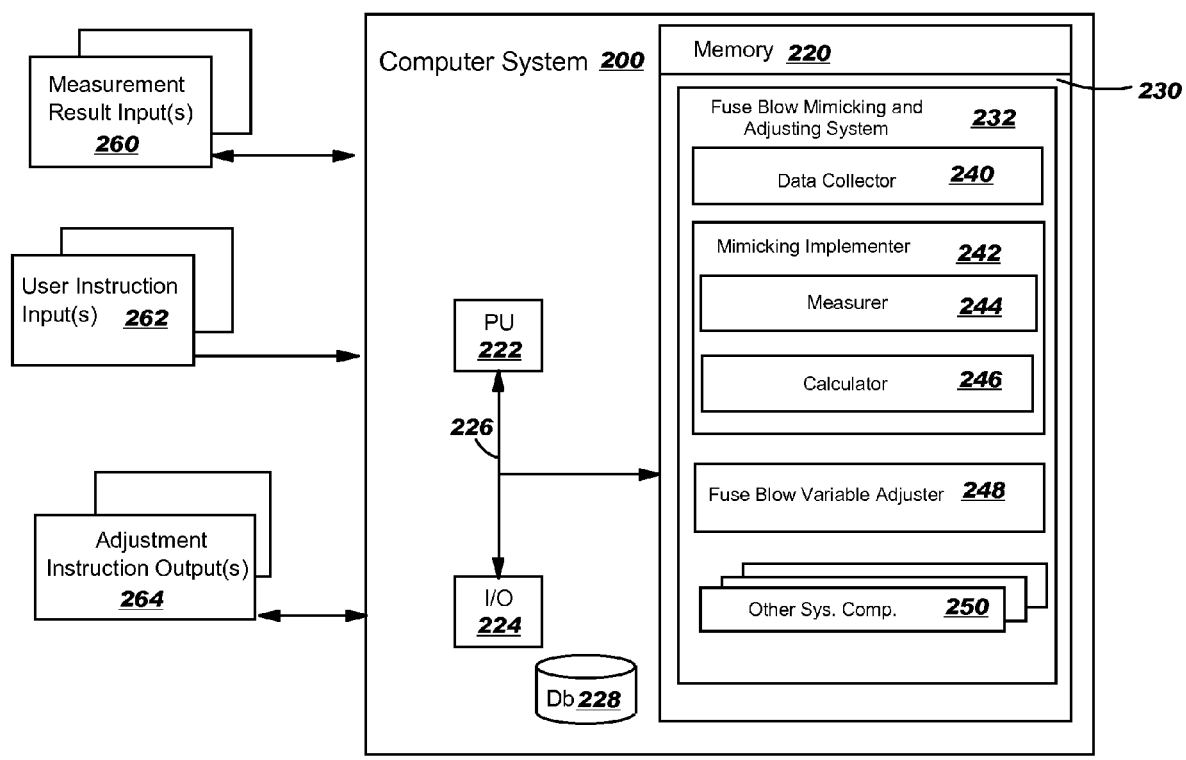
FIG. 4 shows a block diagram of an illustrative computer system according to the invention.

According to one embodiment, a computer system 200 may be used to control the implementation of the method shown in FIG. 3. FIG. 4 shows a block diagram of an illustrative computer system 200. In one embodiment, computer system 200 includes a memory 220, a processing unit (PU) 222, input/output devices (I/O) 224 and a bus 226. A database 228 may also be provided for storage of data relative to processing tasks. Memory 220 includes a program product 230 that, when executed by PU 222, comprises various functional capabilities described in further detail below. Memory 220 (and database 228) may comprise any known type of data storage system and/or transmission media, including magnetic media, optical media, random access memory (RAM), read only memory (ROM), a data object, etc. Moreover, memory 220 (and database 228) may reside at a single physical location comprising one or more types of data storage, or be distributed across a plurality of physical systems. PU 222 may likewise comprise a single processing unit, or a plurality of processing units distributed across one or more locations. I/O 224 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 200.

As shown in FIG. 4, program product 230 may include a fuse blow mimicking and adjusting system 232 that includes a data collector 240; a mimicking implementer 242 including a measurer 244 and a calculator 246; a fuse blow variable adjuster 248; and other system components 250. Other system components 250 may include any now known or later developed parts of a computer system 200 not individually delineated herein, but understood by those skilled in the art.

Inputs to computer system 200 include measurement result inputs 260 and user instruction inputs 262. Measurement result inputs 260 include the data measured by test device 130 (FIG. 2) User instruction inputs 262 include instructions of a user of computer system 200 regarding the operation of, inter alia, fuse blow mimicking and adjusting system 232. User instruction inputs 262 may include, for example, the upper and lower level thresholds used in determining, e.g., the adjustment of fuse blow voltage in step S202 (FIG. 3). Those inputs may be communicated to computer system 200 through I/O 224 and may be stored in database 228 and may be obtained by data collector 240. Outputs of computer system 200 include adjustment instruction outputs 264 that are communicated to, inter alia, a user to adjust an environmental variable, e.g., blow voltage (Vdd) provided by blow enable line 124 (FIG. 2) or are input into automatic control implementation components to automatically adjust blow Vdd provided by blow enable line 124.

In operation, measurer 244 may control the measurement of on current (ion) and off current (ioff) of mimic FET 132 as described in step S201a and S201b. Calculator 246 may conduct the calculation of the difference between on current (ion) and off current (ioff) of mimic FET 132, and may conduct the conversion from the difference between on current (ion) and off current (ioff) of mimic FET 132 to iBLOW of fuses 110, if mimic FET 132 is of different size than fuses 110. Fuse blow variable adjuster 248 may conduct the three-way decision making of step S202 based on the calculation results of calculator 246.

It should be understood that although the above description uses adjusting a fuse blow gate voltage, i.e., blow Vdd provided by blow enable line 124, as an example of fuse blow environmental variables, the current invention is not limited by this example. Adjusting of other fuse blow environmental variables, such as FSource 116 voltage or fuse blow time, are similarly included in the scope of the current invention. In addition, fuse blow environmental variables may be adjusted independently or in combination according to the current invention.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/ driver for a particular computing and/or I/O device, and the like. Further, it is understood that the terms "component" and "system" are synonymous as used herein and represent any combination of hardware and/or software capable of performing some function(s).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for adjusting a fuse blow environmental variable of an electronic fuse on an integrated circuit chip, the electronic fuse including a poly silicon fuse link and a blow n-channel field-effect transistor (NFET) attached to each other, the method comprising:
   providing the electronic fuse, the electronic fuse being coupled to a fuse blow source voltage line, a fuse blow gate voltage line, and a chip ground;
   coupling a mimic NFET to the fuse blow source voltage line, the fuse blow gate voltage line, and the chip ground in same manner as the electronic fuse, except that the mimic NFET is not attached to any poly silicon fuse link;
   measuring an on current (ion) and an off current (ioff) of the mimic NFET under a preset value of the fuse blow environmental variable;
   determining a fuse blow current of the electronic fuse under the preset value of the fuse blow environmental variable based on a difference between the measured on current (ion) and off current (ioff) of the mimic NFET; and
   adjusting the preset value of the environmental variable based on the determined fuse blow current.

2. The method of claim 1, wherein the adjusting step includes comparing the determined fuse blow current with a first threshold and a second threshold, the first threshold being lower than the second threshold.

3. The method of claim 2, further comprising:
   increasing the preset value of the environmental variable if the determined fuse blow current is lower than the first threshold;
   decreasing the preset value of the environmental variable if the determined fuse blow current is higher than the second threshold; and
   maintaining the preset value of the environmental variable if the determined fuse blow current is between the first threshold and the second threshold.

4. The method of claim 1, further comprising disabling the electronic fuse by de-selecting the blow NFET of the electronic fuse.

5. The method of claim 4, wherein the de-selecting step includes using a controllable latch that is attached to the blow NFET.

6. The method of claim 1, wherein the on current (ion) measuring step includes turning on the mimic NFET using a controllable latch that is attached to the mimic NFET.

7. The method of claim 1, wherein the environmental variable includes at least one of a fuse blow source voltage, a fuse blow gate voltage and a fuse blow time.

8. A computer program product for adjusting a fuse blow environmental variable of an electronic fuse on an integrated circuit chip, the electronic fuse including a poly silicon fuse link and a blow n-channel field-effect transistor (NFET) attached to each other, and the electronic fuse being coupled to a fuse blow source voltage line, a fuse blow gate voltage line, and a chip ground, the computer program product comprising:
   computer usable program code configured to:
   control measuring an on current (ion) and an off current (ioff) of a mimic NFET under a preset value of any fuse blow environmental variable, the mimic NFET being coupled to the fuse blow source voltage line, the fuse blow gate voltage line, and the chip ground in same manner as the electronic fuse, except that the mimic NFET is not attached to any poly silicon fuse link;
   determine a fuse blow current of the electronic fuse under the preset value of the fuse blow environmental variable based on a difference between the measured on current (ion) and off current (ioff) of the mimic NFET; and
   determine an adjustment of the preset value of the environmental variable based on the determined fuse blow current.

9. The program product of claim 8, wherein the adjustment determination includes comparing the determined fuse blow current with a first threshold and a second threshold, the first threshold being lower than the second threshold.

10. The program product of claim 9, wherein the program code is further configured to:
   increase the preset value of the environmental variable if the determined fuse blow current is lower than the first threshold;
   decrease the preset value of the environmental variable if the determined fuse blow current is higher than the second threshold; and
   maintain the preset value of the environmental variable if the determined fuse blow current is between the first threshold and the second threshold.

11. The program product of claim 8, wherein the program code is further configured to control disabling the electronic fuse by de-selecting the blow NFET of the electronic fuse.

12. The program product of claim 11, wherein the de-selecting includes using a controllable latch that is attached to the brow NFET.

13. The program product of claim 8, wherein the program code is further configured to control turning on the mimic NFET using a controllable latch that is attached to the mimic NFET in the measurement of the on current (ion).

14. The program product of claim 8, wherein the environmental variable includes at least one of a fuse blow source voltage, a fuse blow gate voltage and a fuse blow time.

15. A system for dynamically adjusting a fuse blow environmental variable of an electronic fuse on an integrated circuit chip, the electronic fuse including a poly silicon fuse link and a blow n-channel field-effect transistor (NFET) attached to each other, and the electronic fuse being coupled to a fuse blow source voltage line, a fuse blow gate voltage line, and a chip ground, the system comprising:
   a measurer for measuring an on current (ion) and an off current (ioff) of a mimic NFET under a preset value of the fuse blow environmental variable, the mimic NFET being coupled to the fuse blow source voltage line, the fuse blow gate voltage line, and the chip ground in same manner as the electronic fuse, except that the mimic NFET is not attached to any poly silicon fuse link;
   a determinator for determining a fuse blow current of the electronic fuse under the preset value of the fuse blow environmental variable based on a difference between the measured on current (ion) and off current (ioff) of the mimic NFET; and
   an adjuster for adjusting the preset value of the environmental variable based on the determined fuse blow current.

16. The system of claim 15, wherein the adjuster compares the determined fuse blow current with a first threshold and a second threshold, the first threshold being lower than the second threshold.

17. The system of claim 15, wherein the adjuster further:
   increases the preset value of the environmental variable if the determined fuse blow current is lower than the first threshold;
   decreases the preset value of the environmental variable if the determined fuse blow current is higher than the second threshold; and
   maintains the preset value of the environmental variable if the determined fuse blow current is between the first threshold and the second threshold.

18. The system of claim 15, wherein the measurer disables the electronic fuse by de-selecting the blow NFET of the electronic fuse.

19. The system of claim 18, wherein the electronic fuse is further attached to a controllable latch.

20. The system of claim 15, wherein the environmental variable includes at least one of a fuse blow source voltage, a fuse blow gate voltage and a fuse blow time.

* * * * *